(12) United States Patent
Bueb

(10) Patent No.: US 8,694,867 B2
(45) Date of Patent: *Apr. 8, 2014

(54) MULTILEVEL ENCODING WITH ERROR CORRECTION

(71) Applicant: Micron Technology, Inc., Boise, ID (US)

(72) Inventor: Christopher Bueb, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/627,915

(22) Filed: Sep. 26, 2012

(65) Prior Publication Data

US 2013/0024749 A1  Jan. 24, 2013

Related U.S. Application Data

(63) Continuation of application No. 12/333,100, filed on Dec. 11, 2008, now Pat. No. 8,321,764.

(51) Int. Cl.
*G06F 11/00* (2006.01)

(52) U.S. Cl.
USPC ....... 714/773; 714/763; 714/777; 365/185.09

(58) Field of Classification Search
None
See application file for complete search history.

(56) References Cited

U.S. PATENT DOCUMENTS

| 5,907,504 | A | 5/1999 | Hayashi |
| 6,118,695 | A | 9/2000 | Yoneyama |
| 6,839,798 | B1 * | 1/2005 | Nagayoshi et al. ........... 711/103 |
| 7,080,309 | B2 | 7/2006 | Sharma |
| 7,231,582 | B2 * | 6/2007 | Worley .......................... 714/773 |
| 7,447,948 | B2 | 11/2008 | Galbi et al. |
| 7,539,052 | B2 | 5/2009 | Aritome |
| 2008/0037320 | A1 | 2/2008 | Radke |
| 2008/0158952 | A1 * | 7/2008 | Aritome ................... 365/185.03 |
| 2008/0168320 | A1 | 7/2008 | Cassuto et al. |
| 2009/0024903 | A1 | 1/2009 | Bueb |

FOREIGN PATENT DOCUMENTS

| EP | 1 912 121 A1 | 4/2008 |
| WO | WO 01/63613 A1 | 8/2001 |

OTHER PUBLICATIONS

Sun et al., "Design of on-chip error correction systems for multilevel NOR and NAND flash memories," IET Circuits Devices Syst., 2007, pp. 241-249, vol. 1, No. 3.

* cited by examiner

*Primary Examiner* — Scott Baderman
*Assistant Examiner* — Jason Bryan
(74) *Attorney, Agent, or Firm* — Knobbe, Martens, Olson & Bear LLP

(57) ABSTRACT

Embodiments of the present disclosure provide methods, systems, and apparatuses related to multilevel encoding with error correction. In some embodiments, a plurality of bits may be encoded into a plurality of memory cells by responding to bits of the plurality of bits by changing the logic levels of corresponding groups of memory cells of the plurality of memory cells. Other embodiments may be described and claimed.

18 Claims, 7 Drawing Sheets

*Figure 5*

MULTILEVEL ENCODING WITH ERROR CORRECTION

CROSS-REFERENCE TO RELATED APPLICATIONS

This application is a continuation of U.S. patent application Ser. No. 12/333,100, filed Dec. 11, 2008, the entire disclosure of which is hereby incorporated herein by reference.

FIELD

Embodiments of the present disclosure relate to the field of memory, and more particularly, to multilevel encoding with error correction.

BACKGROUND

File systems periodically have a need to write data to memory, e.g., flash devices, in small granularities, e.g., something less than a nibble of data. These write granularities are typically too small for existing flash devices to efficiently support error correction codes. Therefore, a popular alternative is to use single bit per cell (SBC) encoding for small writes and to use error correction codes to protect multiple bits per cell (MBC) encoding for large writes. However, omitting error correction on the SBC regions of the flash device compromises its reliability.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 5 includes tables that provide bit combination-to-cell mappings in accordance with an embodiment.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the present disclosure, the phrase "A and/or B" means "(A), (B), or (A and B)." For the purposes of the present disclosure, the phrase "A, B, and/or C" means "(A), (B), (C), (A and B), (A and C), (B and C), or (A, B and C)."

Various logic blocks may be introduced and described in terms of an operation provided by the blocks. These logic blocks may include hardware, software, and/or firmware elements in order to provide the described operations. While some of these logic blocks may be shown with a level of specificity, e.g., providing discrete elements in a set arrangement, other embodiments may employ various modifications of elements/arrangements in order to provide the associated operations within the constraints/objectives of a particular embodiment.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Figure 1:
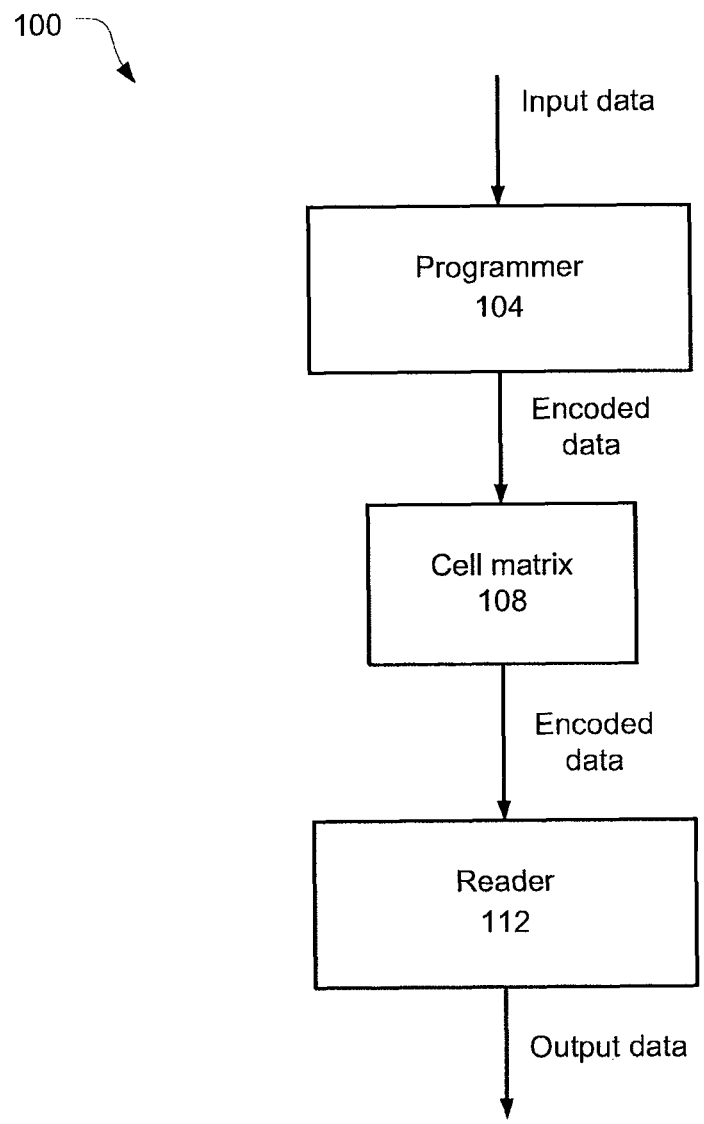
FIG. 1 illustrates a non-volatile memory device in accordance with an embodiment.

FIG. 1 illustrates a non-volatile memory (NVM) device 100 in accordance with an embodiment. The NVM device 100 may include a programmer 104 that receives input data from, e.g., a host device, encodes the input data, and writes the encoded data into a cell matrix 108 with which it is coupled. The cell matrix 108 may be a matrix of memory cells that are each formed by a floating gate metal oxide semiconductor (MOS) transistor. In other embodiments, other transistor or transistor-like technologies may be used.

The NVM device 100 may also include a reader 112 coupled to the cell matrix 108. The reader 112 may access the encoded data stored in the cell matrix 108 by using one or more sense amplifiers to read voltage levels, Vt, of the various cells and determine the logic level, or "cell state" by comparing the voltage levels to one or more threshold values. Multilevel memory cells (MLCs) may have more than two logic levels, or "cell states," determined by the one or more sense amplifiers comparing the Vt of a particular MLC to a plurality of voltage thresholds. Thus, a logic level may correspond to a discrete range of Vt.

After accessing the encoded data, the reader 112 may decode the data in a manner that is complementary to the encoding operation of programmer 104. The reader 112 may then provide the output data to, e.g., the host device.

In some embodiments, the programmer 104 may be a unidirectional programmer. That is, the programmer 104 may engage in program operations (e.g., writes) only in one direction, e.g., changing a bit value from a one to a zero. In order to change a bit value in the direction opposite the programming direction, an entire block may be erased, e.g., set back to one. The unidirectional programming of the programmer 104 may be desirable due to the underlying memory technology used in the NVM device 100. For example, certain flash memories only support unidirectional programming. Other memory technologies, e.g., phase change memory (PCM), may be more efficient when used with unidirectional programming.

The programmer 104 may encode the data in a manner that increases error correction coverage (ECC) over the scope of possible programming operations that may occur with respect to a given group of cells. This may include small granularity programming operations, e.g., independently programming a number of bits less than a nibble. In some embodiments, the programmer 104 may use an encoding scheme that provides ECC to single-bit granularity programming operations.

The programmer 104 may encode a number of bits of input data into a greater number of MLCs, with the extra cells providing the flexibility to employ the robust encoding scheme described in this disclosure. For example, the programmer 104 may encode a byte of input data, i.e., eight bits, into a group of nine MLCs. The encoding of the byte of input data into the group of MLCs may be done by level-shifting a particular subset of the nine-MLC group for each bit of the byte that is to be programmed. "Level-shifting," as used herein, refers to changing a logic level of a particular MLC.

The MLCs used in this description may include four logic levels (L0, L1, L2, L3). Each MLC may start at L0 and be unidirectionally programmed, e.g., level-shifted, a total of three times up to L3 before being erased. In other embodiments, other MLCs may include any number of logic levels greater than two and/or the MLC may start at L3 and be level-shifted down.

ECC may be described as function of how many cell failures are permitted without resulting in a corresponding read error. To achieve x-cell ECC protection, typically x+2 cells may be level-shifted one level for a minimum granularity programming operation. So, e.g., for one-cell ECC protection in the nine MLC/byte example described above, a subset of three MLCs may be level-shifted to program one bit. Said another way, the total sum of cell state transitions for programming one bit is three, for programming two bits is six, and so on.

Figure 2:
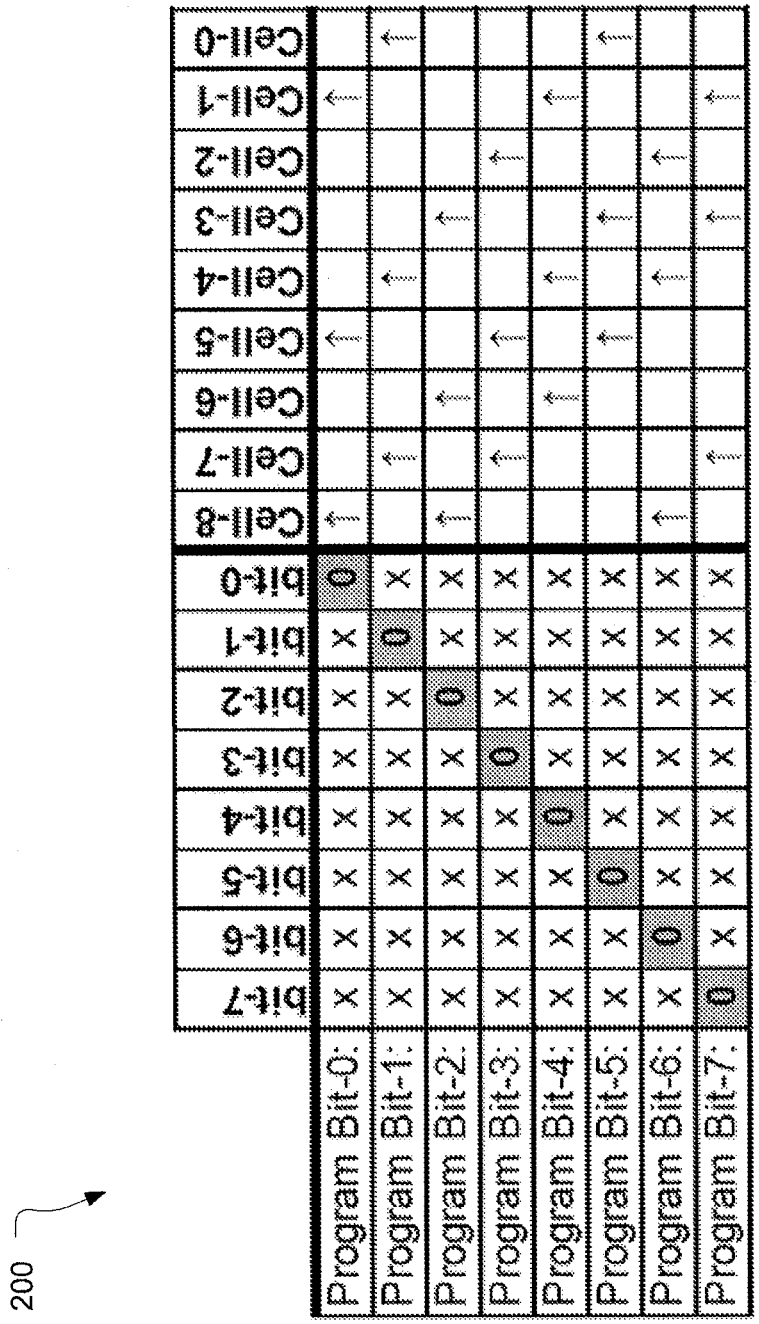
FIG. 2 includes a table providing a bit-to-cell mapping in accordance with an embodiment.

FIG. 2 includes a table 200 providing a bit-to-cell mapping in accordance with an embodiment. In this embodiment, a three-MLC subset may be level-shifted, e.g., by one level, to program a given bit. For example, cell-1, cell-5, and cell-8 may be upshifted one level to program bit-0; cell-0, cell-4, and cell-7 may be upshifted one level to program bit-1; and so on.

Figure 3:
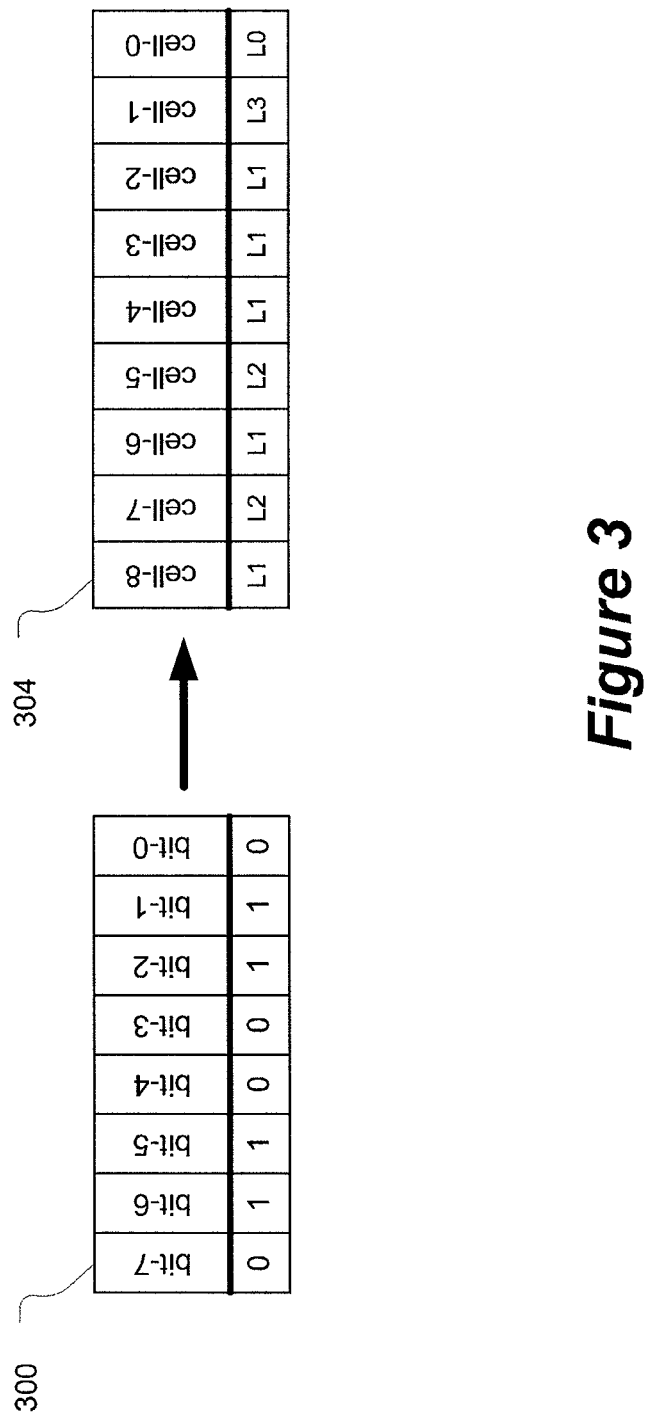
FIG. 3 illustrates an encoding operation in accordance with an embodiment.

FIG. 3 illustrates an encoding operation in accordance with an embodiment. In this embodiment, the programmer 104 may receive input data 300 having a hexadecimal value of 66 ("66h") and a corresponding byte value shown in FIG. 3. The programmer 104 may encode the bits of the input data into the cell group 304 according to the bit-to-cell mapping provided by table 200. It may be noted that some of the cells are upshifted by more than one level due to their being used to program more than one bit in a particular programming iteration. For example, cell-7 will be upshifted in order to program both bit-3 and bit-7. Therefore, cell-7 is upshifted from L0, by two levels, to L2. In this manner, linear superposition may apply to the level-shifting of the various cells.

Given the described encoding scheme and a one-bit programming granularity, a nine MLC group may be subjected to eight consecutive programming iterations without having to use an erase/rewrite operation. With each cell of a nine-MLC group having three possible level-shifts, there may be a total of 27 possible cell state transitions, i.e., 9×3. However, a unidirectional programming embodiment that uses three cell state transitions to program one bit would only use a total of 24 cell state transitions throughout the eight, one-bit programming iterations, i.e., 8×3. Thus, there are three surplus cell state transitions in this embodiment. Cell-0, cell-2, and cell-6 include these surplus cell state transitions, which can be seen with reference to table 200, due to their use to program only two different bits. These surplus cell state transitions, managed by the programmer 104 as described herein, may fully enable one-cell ECC protection for this embodiment.

For one-cell ECC protection on all of the possible values of a given byte, the programmer 104 may manage these surplus cell state transitions in a manner to provide a desired threshold Hamming distance between each of the cell group states that correspond to a byte value. The Hamming distance may be the number of ways two different cell group states differ.

Figure 4:
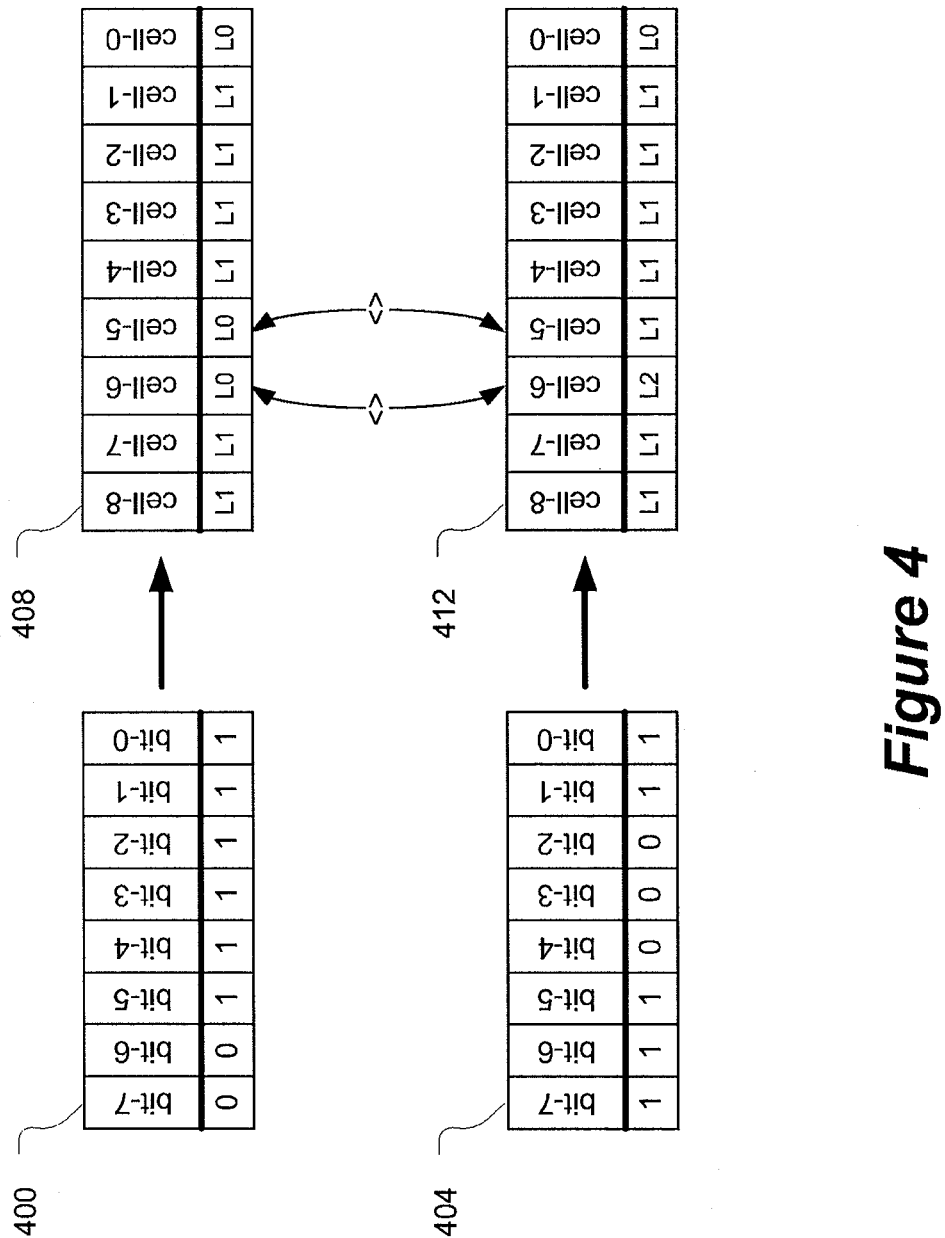
FIG. 4 illustrates encoding operations in accordance with an embodiment.

Encoding data strictly according to the bit-to-cell mapping of table 200 may provide a desired Hamming distance between most of the cell group states, but not all. Specifically, there may be sufficient Hamming distance between approximately 216 of the 256 possible states, with 40 of the possible states having a Hamming distance insufficient to provide one-cell ECC. This may be explained with reference to FIG. 4 in accordance with some embodiments. Consider, e.g., encoding input data 400, which has a byte value of 3Fh, and input data 404, which has a byte value of E3h. This may result in cell group states shown with respect to cell group 408 and cell group 412, respectively. As can be seen, only two cell states, e.g., cell-6 and cell-5, differ between the cell group states of cell group 408 and cell group 412. Accordingly, a read error may occur if cell-5 failed in cell group 408 and cell-6 failed in cell group 412, or vice versa.

Thus, in order to provide a one-cell ECC for the present embodiment, a Hamming distance of three or greater may be desired between all of the cell group states that correspond to the 256 byte values. This may be done by appropriately managing the surplus cell state transitions as follows.

When the programmer 104 detects a value of the input data to be encoded that is associated with a Hamming distance below a desired threshold, it may utilize the surplus cell state transition by level-shifting an associated cell. This level-shift may be in addition to level-shifts that encode the input data itself.

Figure 5:
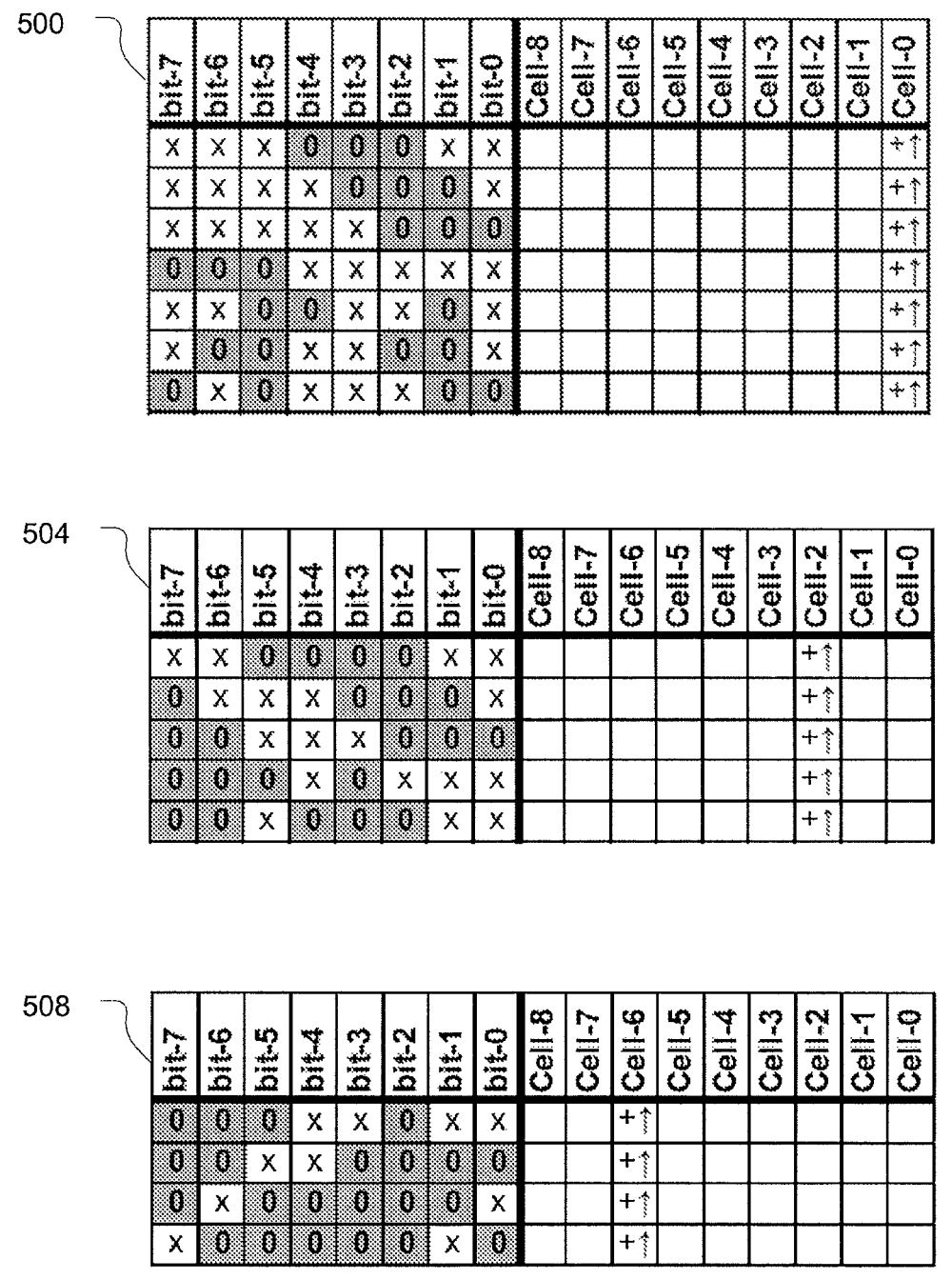

FIG. 5 includes tables 500, 504, and 508 that provide bit combination-to-cell mappings in accordance with this embodiment. In the event that the programmer 104 detects any of the predetermined, or "flagged," bit combinations shown in table 500, it may level-shift cell-0 one Vt level to use its surplus cell state transition. It may be noted that only some of the bit combinations associated with a Hamming distance less than a desired threshold may need to be flagged. These flagged bit combinations may be determined in a variety of ways in various embodiments.

The programmer 104 may use up the surplus cell state transition of cell-2 and cell-6 in a similar manner using tables 504 and 508, respectively.

Utilizing the surplus cell state transitions in this manner may result in a byte value of 00h corresponding to all cells of a nine-cell group being programmed at L3 and a desired Hamming distance of three or greater between all of the cell group states that correspond to the 256 byte values.

Figure 6:
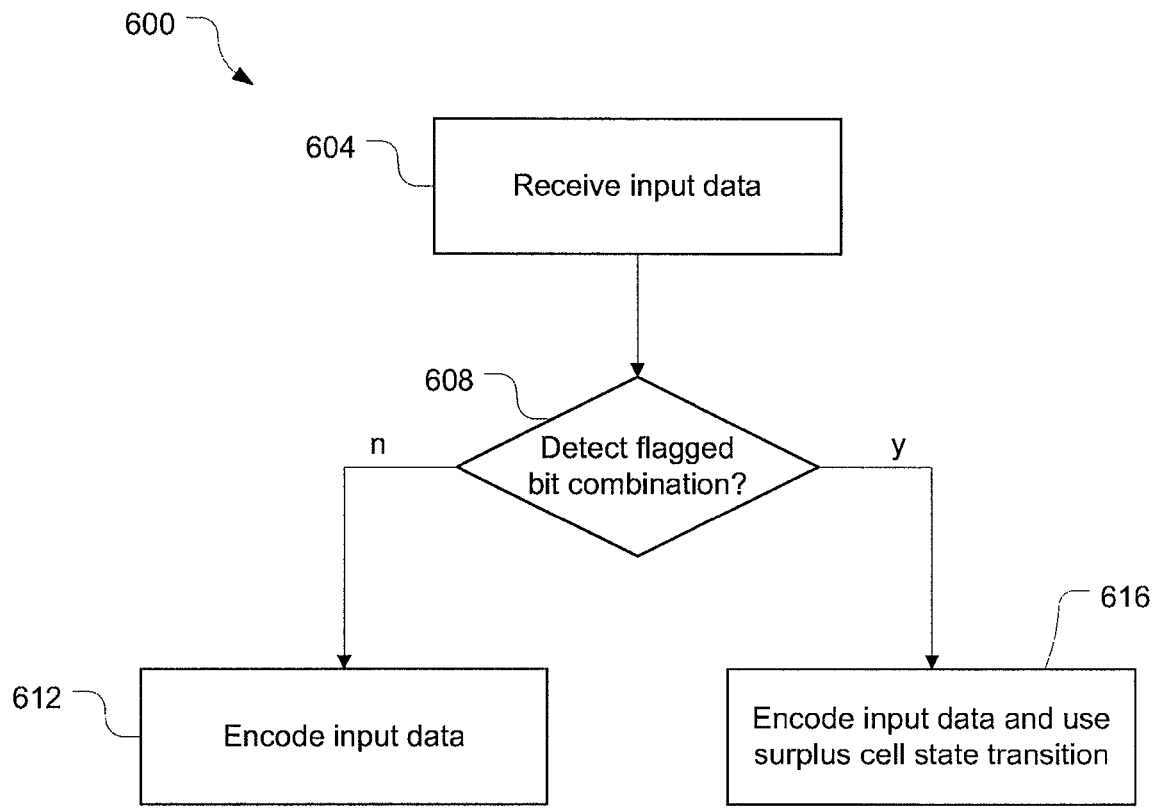
FIG. 6 illustrates an encoding operation in accordance with an embodiment.

FIG. 6 is a flowchart 600 depicting an encoding operation of the programmer 104 in accordance with an embodiment. At block 604, the programmer may receive input data from, e.g., a host device, that is to be stored in the NVM device 100.

At block 608, the programmer 104 may determine whether there is a flagged bit combination detected in the received input data. This may be done by reference to mappings provided in the tables of FIG. 5, for example.

If a flagged bit combination is not detected at block 608, the programmer 104 may, at block 612, encode the input data into the cell matrix 108 according to table 200, for example.

If a flagged bit combination is detected at block 608, the programmer 104 may, at block 616, encode the input data into the cell matrix 108 according to table 200, for example, and use the surplus cell state transition according to one of the tables of FIG. 5, for example.

While the above embodiments describe the encoding of a number of bits, e.g., 8, into a greater number of cells, e.g., 9, other embodiments may encode a number of bits into an equal number of cells (or even less cells). In some embodiments, the number of cells M, which may each be level-shifted a total of L times before being erased, used to encode a number of bits B to obtain a desired Hamming distance D may be selected to satisfy (M*L)>(B*H).

Figure 7:
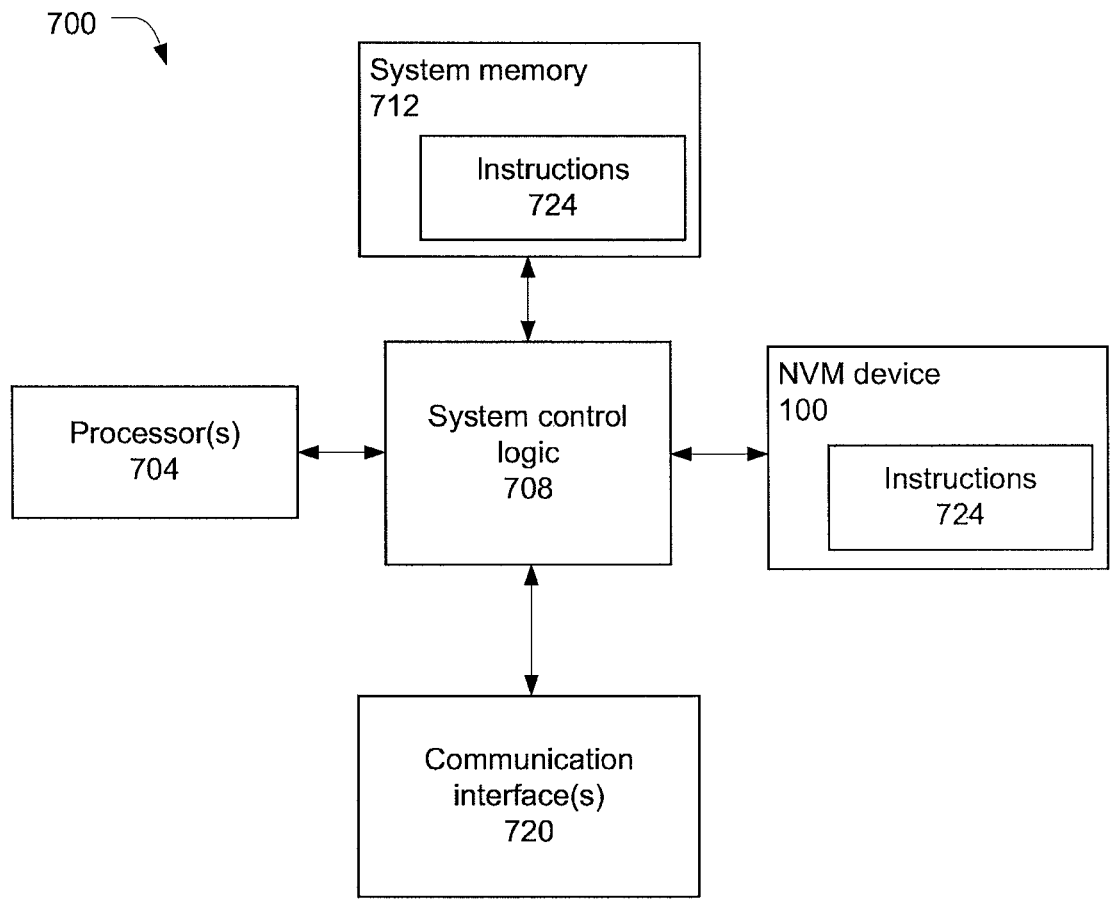
FIG. 7 illustrates a host device incorporating an NVM device in accordance with an embodiment.

FIG. 7 illustrates a host device 700 that may host the NVM device 100 in accordance with some embodiments. The host device 700 may include one or more processors 704; system control logic 708 coupled to at least one of the processor(s) 704; system memory 712 coupled to the system control logic 708; the NVM device 100 coupled to the system control logic 708; and one or more communication interface(s) 720 coupled to the system control logic 708.

System control logic 708 for one embodiment may include any suitable interface controllers to provide for any suitable interface to the components with which it is coupled.

System memory 712 may be used to load and/or store data/instructions, for example, for the host device 700. System memory 712 may include any suitable volatile memory, such as, but not limited to, suitable dynamic random access memory (DRAM).

The NVM device 100 may also be used to load and/or store data/instructions, for example, for the host device 700. The NVM device 100 may include any suitable non-volatile memory, such as, but not limited to, NOR flash memory, NAND flash memory, phase change memory, etc.

In some embodiments, encoding/decoding logic may include instructions 724 that when executed by the processor(s) 704 result in the host device 700 and/or the NVM device 100 performing at least some of the encoding/decoding operations described herein. The instructions may be located in the NVM device 100 and/or the system memory 712. In some embodiments, the instructions 724 may additionally/alternatively be located in the system control logic 708.

Communication interface(s) 720 may provide an interface for the host device 700 to communicate over one or more networks and/or with any other suitable device. Communication interface(s) 720 may include any suitable hardware and/or firmware. Communication interface(s) 720 for one embodiment may include, for example, a network adapter, a wireless network adapter, a telephone modem, and/or a wireless modem. For wireless communications, communication interface(s) 720 for one embodiment may use one or more antennas.

For one embodiment, at least one of the processor(s) 704 may be packaged together with logic for one or more controllers of system control logic 708. For one embodiment, at least one processor of the processor(s) 704 may be packaged together with logic for one or more controllers of system control logic 708 to form a System in Package (SiP). For one embodiment, at least one processor of the processor(s) 704 may be integrated on the same die with logic for one or more controllers of system control logic 708. For one embodiment, at least one processor of the processor(s) 704 may be integrated on the same die with logic for one or more controllers of system control logic 708 to form a System on Chip (SoC).

In various embodiments, the host device 700 may be a desktop or laptop computer, a server, a set-top box, a digital recorder, a game console, a personal digital assistant, a mobile phone, a digital media player, a digital camera, etc. The host device 700 may have more or less components and/or different architectures.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Similarly, memory devices of the present disclosure may be employed in host devices having other architectures. This application is intended to cover any adaptations or variations of the embodiments discussed herein. Therefore, it is manifestly intended that embodiments in accordance with the present disclosure be limited only by the claims and the equivalents thereof.

What is claimed is:

1. A method of encoding a plurality of bits into a plurality of memory cells, each memory cell of the plurality of memory cells configured to have an information state selected from among more than two logic levels, the method comprising:
   responding to a first bit of the plurality of bits by changing the states of a first group of memory cells of the plurality of memory cells; and
   responding to a second bit of the plurality of bits by changing the states of a second group of memory cells of the plurality of memory cells, wherein at least one memory cell of the plurality of memory cells is in both of the first group and the second group and at least one memory cell of the plurality of memory cells is in the first group but is not in the second group.

2. The method of claim 1, further comprising responding to a predetermined bit combination of the plurality of bits by changing the state of a predetermined memory cell of the plurality of memory cells.

3. The method of claim 2, wherein changing the state of the predetermined memory cell comprises changing the state by one logic level.

4. The method of claim 1, wherein the plurality of memory cells are unidirectionally programmable.

5. The method of claim 1, wherein changing the states of the first group of memory cells comprises changing the state of each memory cell of the first group of memory cells by one logic level.

6. The method of claim 5, wherein changing the states of the second group of memory cells comprises changing the state of each memory cell of the second group of memory cells by one logic level.

7. The method of claim 1, wherein said method further comprises:
   responding to a third bit of the plurality of bits by changing the states of a third group of memory cells of the plurality of memory cells, wherein at least one memory cell of the plurality of memory cells is in both of the second group and the third group and at least one memory cell of the plurality of memory cells is in the second group but not in the third group.

8. The method of claim 7, wherein changing the states of the third group of memory cells comprises changing the state of each memory cell of the third group of memory cells by one logic level.

9. The method of claim 1, wherein the at least one state of the at least one memory cell in both of the first group and the second group is shifted by two or more logic levels.

10. The method of claim 1, further comprising controlling the plurality of memory cells to maintain a predetermined threshold Hamming distance between states of the plurality of memory cells.

11. The method of claim 10, wherein said controlling comprises:

determining whether the plurality of bits has a predetermined value; and changing the states of one or more memory cells of the plurality of memory cells in response at least in part to the plurality of bits having the predetermined value.

12. The method of claim 10, wherein the plurality of memory cells has M memory cells, the state of each memory cell of the plurality of memory cells is configured to be changed a total of L times before being erased, the plurality of bits has B bits, and the predetermined threshold Hamming distance is H, and M, L, B, and H satisfy $(M*L) > (B*H)$.

13. An apparatus comprising:

a plurality of memory cells, wherein each memory cell of the plurality of memory cells is configured to have an information state selected from among more than two logic levels; and a decoder coupled to the plurality of memory cells, wherein the decoder is configured to receive information from the plurality of memory cells that has been encoded by the method of claim 1 and to decode the received information in a decoding operation that is complementary to the method of claim 1.

14. An apparatus comprising:

a plurality of memory cells, wherein each memory cell of the plurality of memory cells is configured to have an information state selected from among more than two logic levels; and an encoder coupled to the plurality of memory cells, the encoder configured to perform an encoding operation comprising:

receiving data from a device, the data comprising a plurality of bits;

responding to a first bit of the plurality of bits by changing the states of a first group of memory cells of the plurality of memory cells; and responding to a second bit of the plurality of bits by changing the states of a second group of memory cells of the plurality of memory cells, wherein at least one memory cell of the plurality of memory cells is in both of the first group and the second group and at least one memory cell of the plurality of memory cells is in the first group but is not in the second group.

15. The apparatus of claim 14, wherein the encoding operation further comprises responding to a predetermined bit combination of the plurality of bits by changing the state of a predetermined memory cell of the plurality of memory cells.

16. The apparatus of claim 14, further comprising a decoder coupled to the plurality of memory cells, the decoder configured to receive encoded information from the plurality of memory cells, to decode the encoded information in a manner that is complementary to the encoding operation, and to provide the decoded information to the device.

17. A system that comprises stored instructions that, when executed, cause the system to encode a plurality of bits into a plurality of memory cells, each memory cell of the plurality of memory cells configured to have an information state selected among more than two logic levels, wherein said encoding comprises:

responding to a first bit of the plurality of bits by changing the states of a first group of memory cells of the plurality of memory cells; and responding to a second bit of the plurality of bits by changing the states of a second group of memory cells of the plurality of memory cells, wherein at least one memory cell of the plurality of memory cells is in both of the first group and the second group and at least one memory cell of the plurality of memory cells is in the first group but is not in the second group.

18. The system of claim 17, wherein the instructions, when executed, further cause the system to control the plurality of memory cells to maintain a Hamming distance between states of the plurality of memory cells.

* * * * *